(12) United States Patent
Park et al.

(10) Patent No.: US 7,160,500 B2
(45) Date of Patent: Jan. 9, 2007

(54) METHOD OF FABRICATING A MICRO DEVICE

(75) Inventors: Joon-Shik Park, Kyunggi-do (KR); Soon-Sup Park, Kyunggi-do (KR); Suk-Won Jung, Chungcheongnam-do (KR); Jin-Woo Cho, Kyunggi-do (KR)

(73) Assignee: Korea Electronics Technology Institute, Kyunggi-do (KR)

( * ) Notice: Subject to any disclaimer, the term of this patent is extended or adjusted under 35 U.S.C. 154(b) by 560 days.

(21) Appl. No.: 10/270,519

(22) Filed: Oct. 16, 2002

(65) Prior Publication Data

US 2003/0080478 A1 May 1, 2003

(30) Foreign Application Priority Data

Oct. 30, 2001 (KR) ................. 2001-66985

(51) Int. Cl.
*C04B 33/32* (2006.01)
(52) U.S. Cl. ............... 264/645; 264/656; 264/670
(58) Field of Classification Search ............ 264/645, 264/656, 670, 241, 657, 642, 654, 655, 678, 264/618, 171.1, 272.11, 272.16, 171.15, 171.24
See application file for complete search history.

(56) References Cited

U.S. PATENT DOCUMENTS

| | | | | |
|---|---|---|---|---|
| 5,164,920 A * | 11/1992 | Bast et al. | .................. | 367/140 |
| 5,340,510 A * | 8/1994 | Bowen | ........................ | 264/434 |
| 5,676,906 A * | 10/1997 | Hirata | ........................ | 264/430 |
| 6,168,737 B1 * | 1/2001 | Poco et al. | ................. | 264/129 |
| 6,278,224 B1 | 8/2001 | Sawada et al. | ............. | 310/334 |
| 6,620,287 B1 * | 9/2003 | Cass | .......................... | 156/296 |
| 6,713,238 B1 * | 3/2004 | Chou et al. | ................. | 430/322 |
| 2004/0028875 A1 * | 2/2004 | Van Rijn et al. | ............. | 428/98 |
| 2005/0156362 A1 * | 7/2005 | Arnold et al. | .............. | 264/618 |
| 2005/0156491 A1 * | 7/2005 | Scott | ......................... | 310/334 |

* cited by examiner

*Primary Examiner*—Carlos Lopez
(74) *Attorney, Agent, or Firm*—Bacon & Thomas, PLLC

(57) ABSTRACT

The present invention relates to a method of fabricating a micro device, comprising the steps of pressing an upper mold formed with a plurality of recesses for molding a plurality of rods and a lower mold formed with a seat recess for molding a plate supporting the plurality of rods against each other; injecting ceramic material mixed with a polymer into the mold; releasing a resultant ceramic molding mixed with the polymer from the molds; removing the polymer from the ceramic molding by burning out or melting away the polymer; sintering the ceramic molding; filling a polymer into spaces between the plurality of rods of the sintered ceramic molding so that the top surfaces of the plurality of rods are exposed to the outside; and removing the plate through a polishing process so that bottom surfaces of the plurality of rods are exposed to the outside.

7 Claims, 8 Drawing Sheets

METHOD OF FABRICATING A MICRO DEVICE

BACKGROUND OF THE INVENTION

1. Field of the Invention

The present invention relates to a method of fabricating a micro device and a method of manufacturing a mold for molding the micro device, and more particularly, to a method of fabricating a micro device and a method of manufacturing a mold for molding the micro device, wherein an array of rods in the order of micron can be mass-produced through injection molding and the characteristics of the micro device can be improved by forming the rods with suitable geometry.

2. Description of the Prior Art

Generally, a micro device made of ceramic materials has been employed in a micro sensor, a micro actuator, a micro transducer and the like.

A method of fabricating such a micro device is shown in FIGS. 1a to 1d.

First, a PZT ($Pb(Zr_xTi_{1-x})O_3$)-sintered plate 11 having a thickness of 800 μm to 1000 μm is prepared as shown in FIG. 1a. The plate 11 is diced by a depth of 300 μm to 600 μm from a top surface of the plate in x and y directions with a dicing wheel 10, so that a plurality of PZT rods 12 are formed on the PZT-sintered plate 11 (see FIG. 1b).

Epoxy 13 is filled into spaces between the PZT rods 12 in such a manner that top surfaces of the PZT rods 12 are exposed from the epoxy 13 (see FIG. 1c).

In order to cause bottom surfaces of the respective PZT rods 12 to be exposed to the outside, the PZT-sintered plate 11 supporting the PZT rods 12 is removed through a polishing process (see FIG. 1d).

The width and length of each of the PZT rods 12 constructed as such are about 100 μm to 200 μm, respectively. The height thereof is about 300 μm to 600 μm, and an interval between the adjacent rods is about 40 μm to 100 μm.

Therefore, the PZT-sintered plate is diced with the wheel, and thus, a micro device having the PZT rods in the order of micron is completed.

In addition, if electrodes are formed on the exposed top and bottom surfaces of the PZT rods, the micro device can be used as an actuator or transducer.

FIG. 2 shows an operating state of a general micro device. The epoxy is filled into spaces between a plurality of PZT rods in the order of micron, and electrodes 14, 15 are formed on the top and bottom surfaces of the plurality of rods. When an alternating voltage is applied to the electrodes 14, 15 from an alternating power supply 16, the micro device is operated as the actuator or transducer.

Alternatively, such a micro device may be used as a sensor for detecting ultrasonic waves.

Since the rods in the order of micron are formed by the dicing wheel in the conventional method of fabricating the micro device described above, it takes considerable working time to form a large number of rods. Thus, it is impossible to mass-produce the micro device.

Furthermore, although the characteristics of the micro sensor, the micro actuator and the micro transducer vary depending on the geometry of the rods, only the rods taking the geometry of an uniform square pillar can be obtained in the process performed by the dicing wheel. Thus, the characteristics of the micro device cannot be further improved.

SUMMARY OF THE INVENTION

Therefore, the present invention is contemplated to solve the above problems in the prior art. A primary object of the present invention is to provide a method of fabricating a micro device, wherein an array of rods in the order of micron can be mass-produced through injection molding and the characteristics of the micro device can be improved by forming the rods with suitable geometry.

Another object of the present invention is to provide a method of manufacturing a mold for easily molding rods in the order of micron.

According to an aspect of the present invention for achieving the primary object, there is provided a method of fabricating a micro device, comprising the steps of pressing an upper mold formed with a plurality of recesses for molding a plurality of rods and a lower mold formed with a seat recess for molding a plate supporting the plurality of rods against each other; injecting ceramic material mixed with a polymer for imparting moldability thereto through runners connected to the lower mold so that it is molded; releasing a resultant ceramic molding mixed with the polymer from the upper and lower molds; removing the polymer from the released ceramic molding mixed with the polymer by burning out or melting away the polymer; sintering the ceramic molding with the polymer removed therefrom; filling a polymer into spaces between the plurality of rods of the sintered ceramic molding so that top surfaces of the plurality of rods are exposed to the outside; and removing the plate through a polishing process so that bottom surfaces of the plurality of rods are exposed to the outside.

According to an aspect of the present invention for achieving the other object, there is provided a method of manufacturing a mold for molding a micro device, comprising the steps of forming a seed layer on a support; forming a photosensitive material layer on the seed layer; masking the photosensitive material layer with a mask formed with a plurality of rod patterns, and exposing and etching the masked photosensitive material layer to form a plurality of rods made of photosensitive material on the seed layer; forming a plated layer made of the same material as the support to cover a top surface of the seed layer and the plurality of rods; and forming a plurality of recesses, which correspond to the plurality of rods, in a bottom surface of the plated layer by sequentially removing the support, the seed layer and the plurality of rods except the plated layer.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION FOR PREFERRED EMBODIMENT

Hereinafter, preferred embodiments of the present invention will be described in detail with reference to the accompanying drawings.

In order to fabricate a micro device using injection molding in the present invention, a mold for fabricating the micro device should be first manufactured.

Accordingly, FIGS. 3a to 3e show views of sequential processes of fabricating the micro device according to the present invention.

Figure 1A:
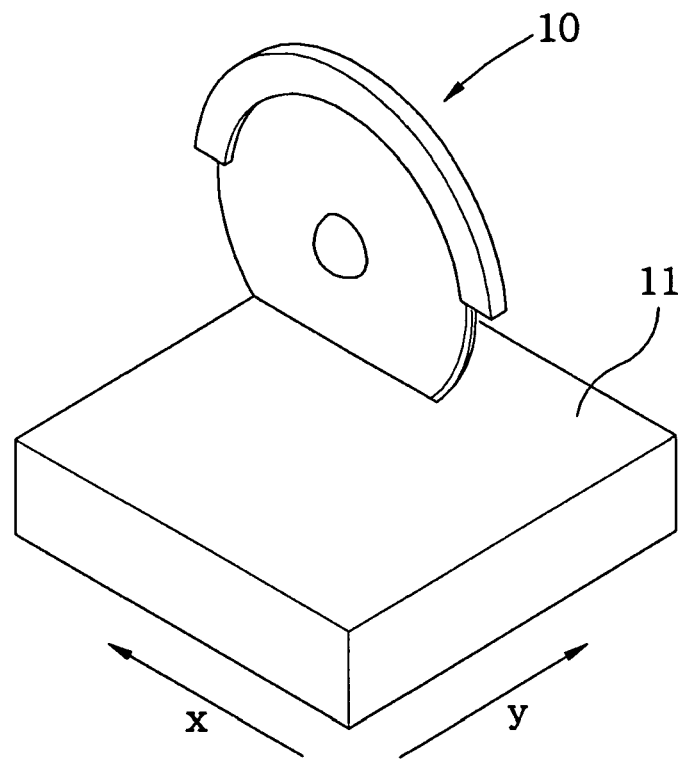
FIGS. 1a to 1d are views of sequential processes of fabricating a conventional micro device made of ceramic.
Figure 1B:
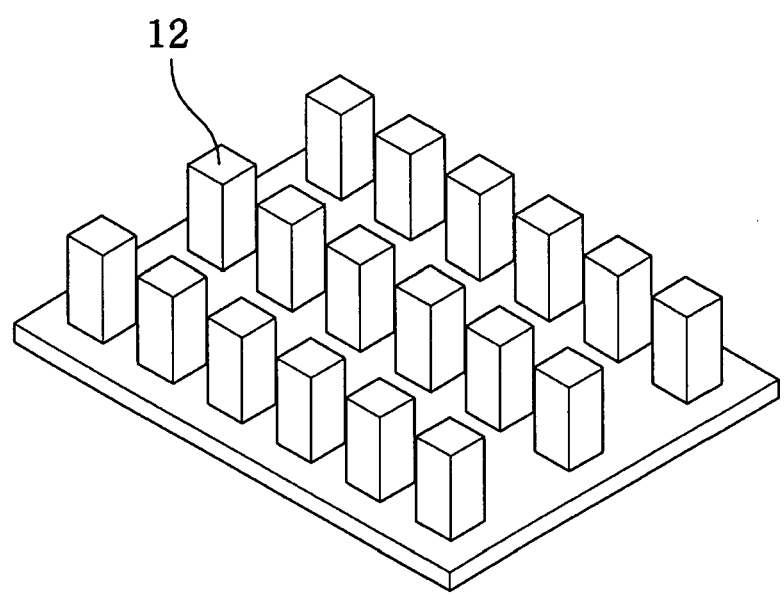
Figure 1C:
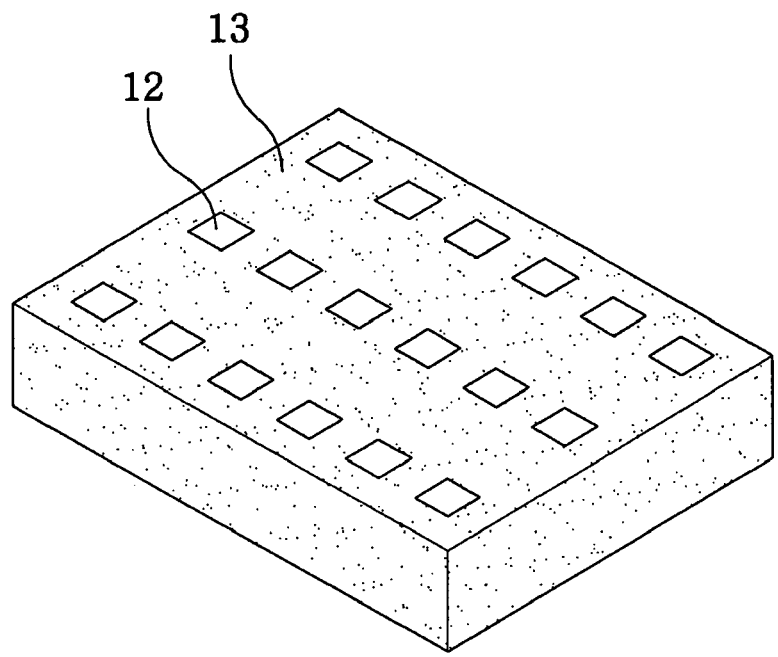
Figure 1D:
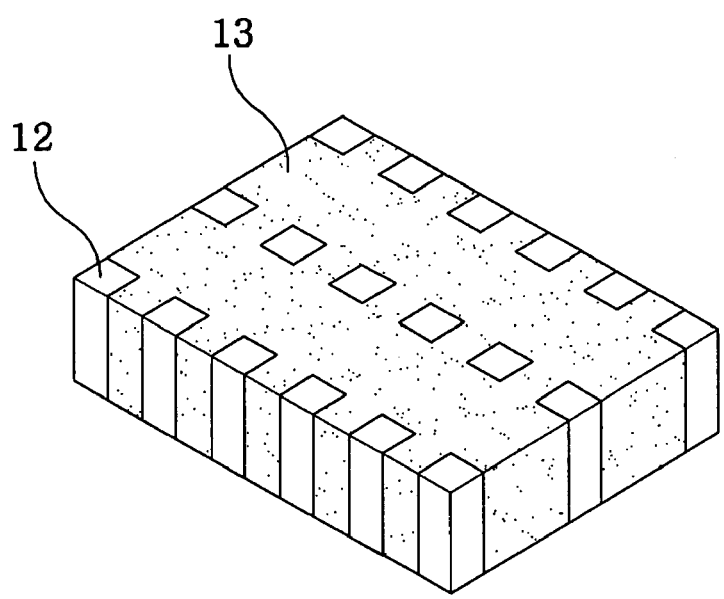
Figure 2:
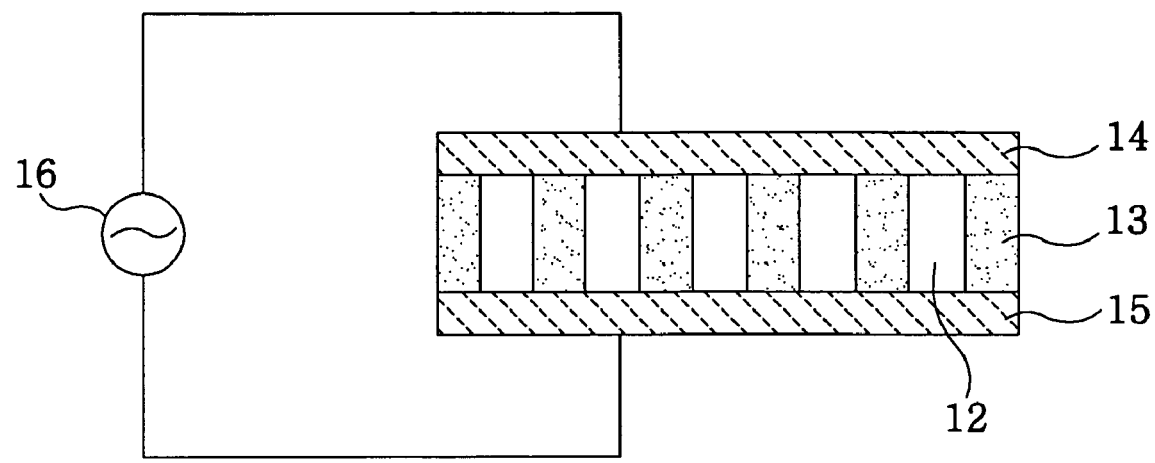
FIG. 2 is a view showing an operating state of a general micro device.
Figure 3A:
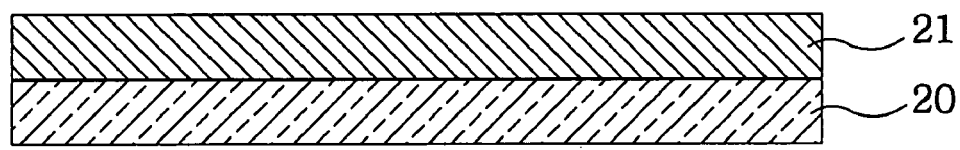
FIGS. 3a to 3e are views of sequential processes of fabricating a micro device according to the present invention.

First, a seed layer 21 is formed on a support 20 (see FIG. 3a).

At this time, the support 20 is preferably made of any one selected from a group consisting of Ni, NiW, NiP and NiB. The seed layer 21 is preferably any one selected from a group consisting of a Ti layer, an Au layer and a Cr/Au layer.

Figure 3B:
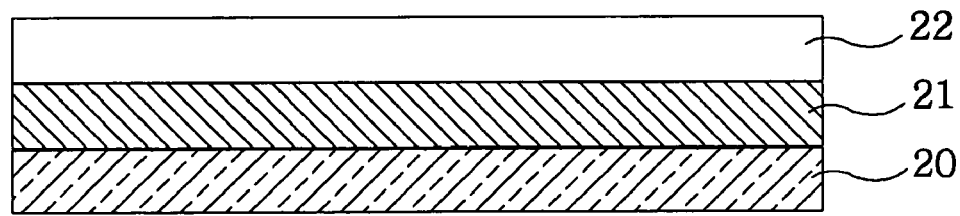

Then, a photosensitive material layer 22 of poly methyl methacrylate (PMMA) or photoresist is formed on the seed layer 21 (see FIG. 3b). It is preferred that the poly methyl methacrylate be used for the photosensitive material layer 22. If the poly methyl methacrylate is used for the photosensitive material layer, it can be made by simply attaching the poly methyl methacrylate onto the seed layer 21.

Figure 3C:
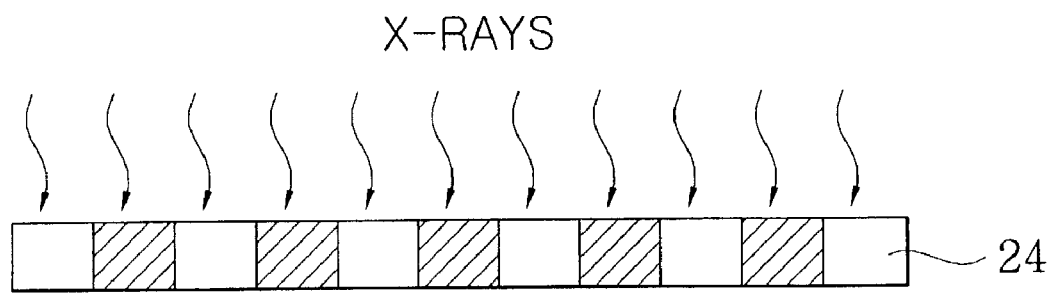
Figure 3D:
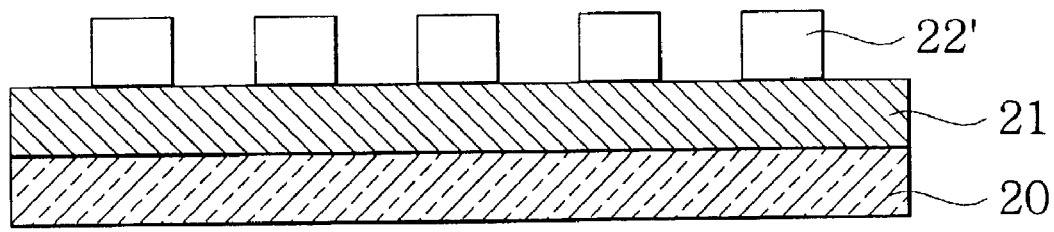

Then, the photosensitive material layer 22 is masked with a mask 24 formed with a plurality of rod patterns and is subsequently exposed to x-rays (see FIG. 3c). Thereafter, the photosensitive material layer 22 is etched except the exposed portions, so that a plurality of rods 22' made of the photosensitive material are formed on the seed layer 21 (see FIG. 3d).

Figure 3E:
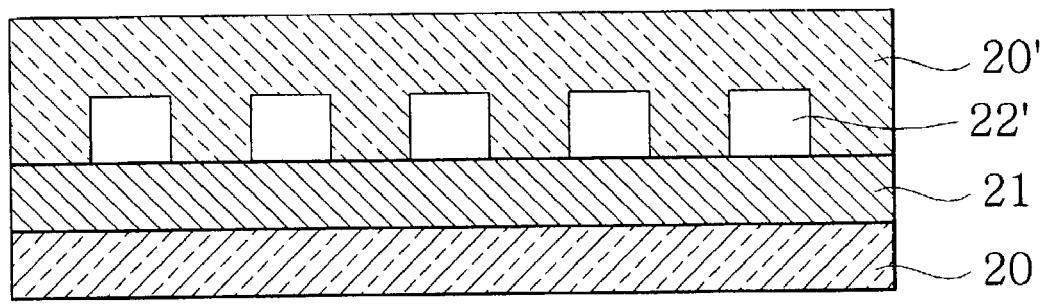

FIG. 3e shows that a plated layer 20' made of the same material as the support 20 is formed to cover a top surface of the seed layer 21 and the plurality of rods 22'.

Then, the support 20, the seed layer 21 and the plurality of rods 22' except the plated layer 20' are sequentially removed. Accordingly, a bottom surface of the plated layer 20' is formed with a plurality of recesses corresponding to the plurality of rods. As a result, a mold capable of molding rods for use in a micro device is completed.

Such a plated layer becomes the mold for molding the micro device. Any one selected from a group consisting of TiN, TiC, WC and diamond is deposited onto the surface of the plated layer in which the plurality of recesses are formed, in order to increase wear resistance thereof. Thus, the mold can be prevented from being worn out.

Moreover, it is preferred that $TiO_2$ be further deposited onto the surface of the plated layer in which the plurality of recesses are formed, in order to allow the molded micro device to be easily released.

Most preferably, $TiO_2$ is deposited using a self-assembled mono-layer (SAM) method.

Figure 4A:
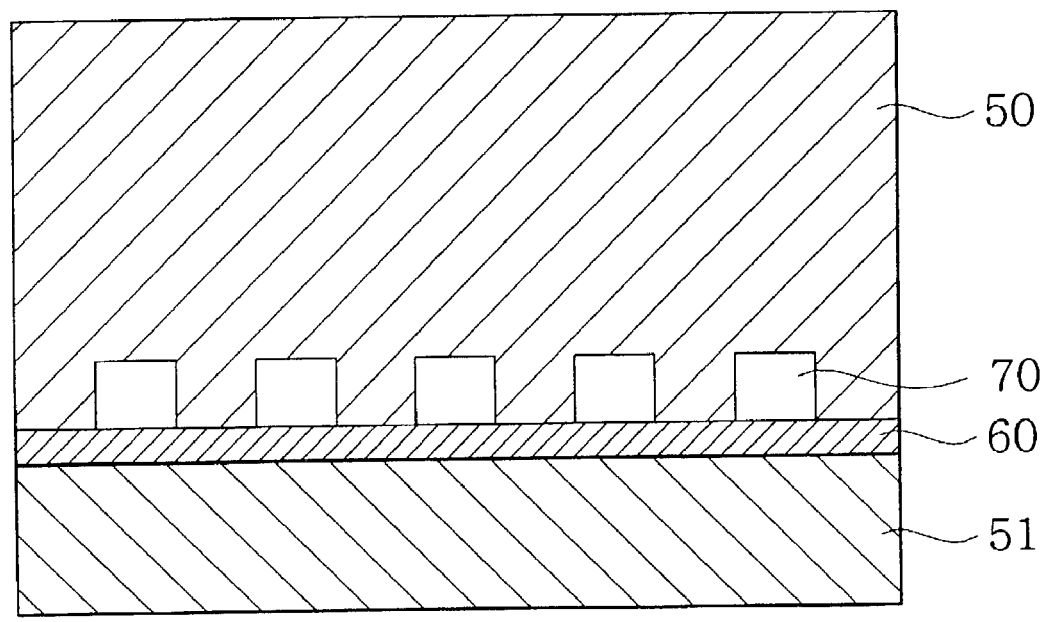
FIGS. 4a to 4c are views showing molding of the micro device in a mold according to the present invention.
Figure 4B:
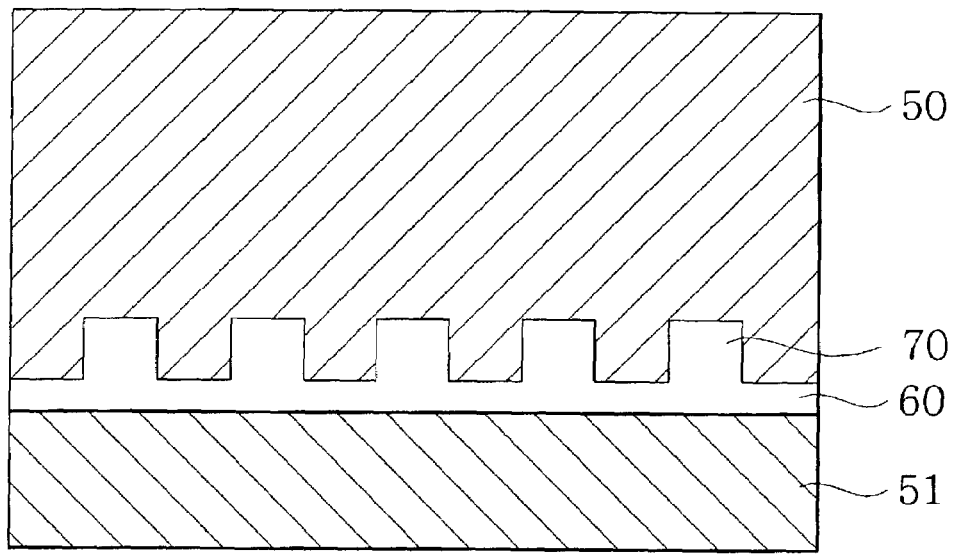
Figure 4C:
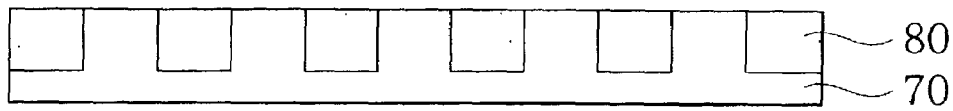

FIGS. 4a to 4c are views showing molding of the micro device in the mold according to the present invention. In FIG. 4a, an upper mold 50 which has been manufactured by the method shown in FIGS. 3a to 3e to have the plurality of recesses for molding the plurality of rods is installed, a plate 60 for supporting the plurality of rods to be formed in the plurality of recesses of the upper mold is seated in a seat recess of a lower mold 51, and then the upper and lower molds 50, 51 are pressed against each other.

Then, when ceramic material mixed with a polymer 70 for imparting moldability thereto is injected through runners connected to the lower mold 51, the micro device of the present invention can be molded.

Subsequently, any one polymer 80 selected from a group consisting of epoxy resin, urethane rubber and silicon rubber is filled into the spaces between the plurality of adjacent rods and the plate is then removed. Consequently, the micro device of the present invention is completed.

In FIG. 4b, the micro device of the present invention can be fabricated without installing the plate 60. The upper mold 50 formed with the plurality of recesses for molding the plurality of rods and a lower mold 51 formed with a seat recess in which a plate for supporting the plurality of rods is molded are pressed against each other. Then, the molding is performed by injection the ceramic material mixed with a polymer 70 for imparting moldability thereto through the runners connected to the lower mold 51. Thus, the plate for supporting the plurality of rods is molded out of the ceramic material.

The plurality of rods and the plate molded out of the ceramic material mixed with the polymer are subsequently released from the upper and lower molds. Thereafter, the polymer is burned out or melted away from the ceramic material mixed with the polymer, and the resultant is sintered. Then, a polymer 80 is filled into the spaces between the plurality of adjacent rods so that the top surfaces of the plurality of rods are exposed to the outside. As a result, a structure having the shape shown in FIG. 4c is obtained.

Herein, the ceramic material is any one selected from a group consisting of PZT ($Pb(Zr_xTi_{1-x})O_3$), PLZT ($(Pb, La)(Zr_xTi_{1-x})O_3$) and BST($(Ba, Sr)TiO_3$).

Figure 5:
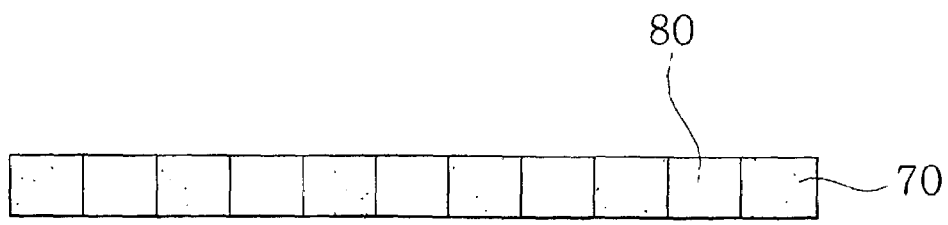
FIG. 5 is a sectional view of the micro device molded according to the present invention.

FIG. 5 is a sectional view of the micro device molded according to the present invention. From the structure shown in FIG. 4c, the plate for supporting the plurality of rods is completely removed through a polishing process so that the bottom surfaces of the rods are exposed to the outside. Thus, the micro device of the present invention is completely fabricated.

Further, it is preferred that the top surfaces of the plurality of rods be also subjected to the polishing process to remove impurities or the like thereon.

The height of each of the rods for the micro device molded as such is 300 μm to 600 μm, the width and the length thereof are 100 μm to 200 μm, and the interval between the adjacent rods is 40 μm to 100 μm. Thus, a large number of rods taking the geometry of a square pillar in the order of micron can be implemented through such a simple injection molding.

Figure 6A:
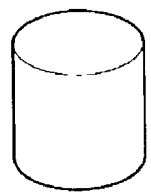
FIGS. 6a to 6c are views showing various geometry of micro rods molded according to the present invention.
Figure 6B:
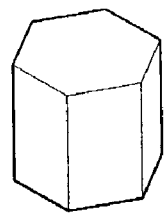
Figure 6C:
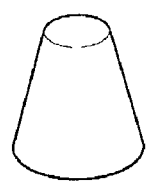

FIGS. 6a to 6c are views showing various geometry of micro rods molded according to the present invention. The geometry of the micro rods according to the present invention can be implemented as a cylinder shown in FIG. 6a, a hexagonal pillar shown in FIG. 6b and a truncated cone shown in FIG. 6c.

Since the rods for the micro device according to the present invention are manufactured through the injection molding rather than the dicing process by the dicing wheel, it is possible to implement the various geometry of the rods.

More specifically, if the geometry of the plurality of recesses formed in the mold is made to be any one selected from a group consisting of the square pillar, the cylinder, the truncated cone, a polygonal pillar or the like; the geometry of the plurality of rods for the micro device molded by means of such a mold is correspondingly implemented as any one of the square pillar, the cylinder, the truncated cone and the polygon pillar.

Therefore, the present invention allows the geometry of the rods to be freely selected and manufactured so that the micro device is superior in characteristics.

Figure 7:
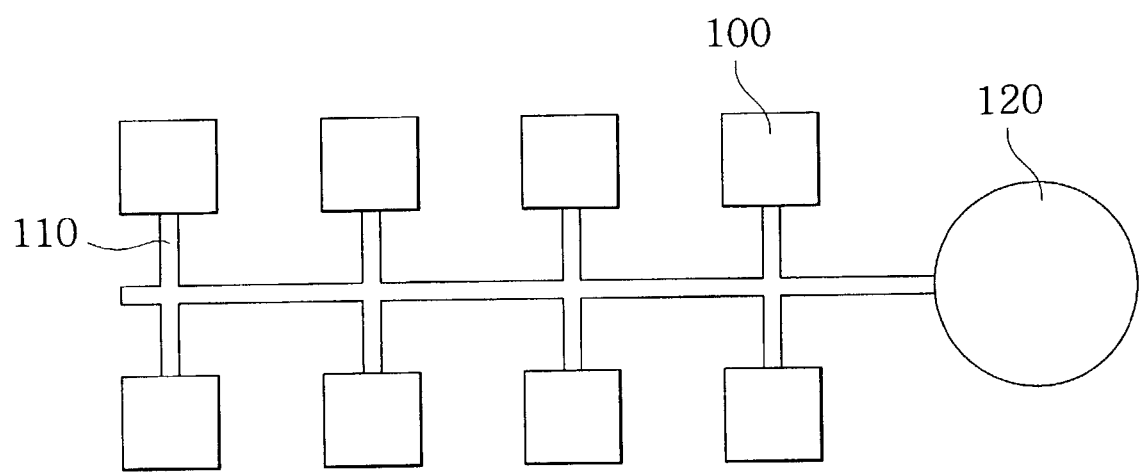
FIG. 7 is a view showing a basic constitution of a lower mold for performing injection molding according to the present invention.

FIG. 7 is a view showing a basic constitution of the lower mold for performing the injection molding according to the present invention. The lower mold comprises cavities 100 in which respective micro devices are molded and each of which is constructed such that the plate for supporting the plurality of rods can be seated therein or has a size of the seat recess capable of molding the plate; runners 110 capable of injecting the ceramic material mixed with the polymer for imparting the moldability thereto into the respective cavities 100; and a cull 120 for supplying the ceramic material to the respective runners 110. The ceramic material mixed with the polymer, which has been contained in the cull 120, is injected into the respective cavities 100 through the runners 110. Thus, the micro device is molded.

As described in detail above, the present invention has advantages in that an array of the rods in the order of micron can be mass-produced through the injection molding and the characteristics of the micro device such as the micro sensor, the micro actuator and the micro transducer can be improved by forming the rods with the suitable geometry.

Although the present invention has been described in detail with respect to the specific examples thereof, it will be apparent to those skilled in the art that various changes and modifications can be made thereto within the technical spirit and scope of the present invention. Such changes and modifications fall within the scope defined by the appended claims.

What is claimed is:

1. A method of fabricating a micro device, comprising the steps of:
    pressing an upper mold formed with a plurality of recesses for molding a plurality of rods and a lower mold formed with a seat recess for molding a plate supporting the plurality of rods against each other;
    injecting ceramic material mixed with a polymer for imparting moldability thereto through runners connected to the lower mold so that it is molded;
    releasing a resultant ceramic molding mixed with the polymer from the upper and lower molds, wherein TiO2 is deposited onto the surfaces of the upper and lower molds in order to allow the ceramic molding mixed with the polymer to be easily released therefrom;
    removing the polymer from the released ceramic molding mixed with the polymer by burning out or melting away the polymer;
    sintering the ceramic molding with the polymer removed therefrom;
    filling a polymer into spaces between the plurality of rods of the sintered ceramic molding so that the top surfaces of the plurality of rods are exposed to the outside; and
    removing the plate through a polishing process so that bottom surfaces of the plurality of rods are exposed to the outside.

2. The method as claimed in claim 1, wherein the ceramic material is any one selected from a group consisting of PZT, PZLT and BST ((Ba, Sr)TiO$_3$).

3. The method as claimed in claim 1, wherein the filled polymer is any one selected from a group consisting of epoxy resin, urethane rubber and silicon rubber.

4. The method as claimed in claim 1, wherein each of the molded rods is a square pillar having a height of 300 μm to 600 μm and a width and length of 100 μm to 200 μm, and an interval between adjacent rods is 40 μm to 100 μm.

5. The method as claimed in claim 1, wherein the geometry of the plurality of recesses is made to be any one selected from a group consisting of a square pillar, a cylinder, a truncated cone and a polygonal pillar.

6. The method as claimed in claim 1, further comprising the step of forming electrodes at the top and bottom surfaces of the plurality of rods so as to use the micro device as any one selected from a group consisting of a micro sensor, a micro actuator and a micro transducer after the step of removing the plate through the polishing process.

7. The method as claimed in claim 1, wherein TiO$_2$ is deposited using a self-assembled mono-layer (SAM) method.

* * * * *